United States Patent [19]
Kelhm, Jr.

[11] 3,953,663
[45] Apr. 27, 1976

[54] VACUUM-HEAT TREATED PRINTED CIRCUIT BOARDS

[75] Inventor: William G. Kelhm, Jr., Farmington, Mich.

[73] Assignee: Burroughs Corporation, Detroit, Mich.

[22] Filed: Jan. 2, 1973

[21] Appl. No.: 320,307

Related U.S. Application Data

[60] Division of Ser. Nos. 794,686, Jan. 28, 1969, Pat. No. 3,708,876, and Ser. No. 2,019, Jan. 12, 1970, Pat. No. 3,755,890, which is a continuation-in-part of Ser. No. 794,686.

[52] U.S. Cl. .......................... 174/68.5; 317/101 B; 29/625
[51] Int. Cl.² ...................... H05K 1/02; H05K 3/22
[58] Field of Search .............. 174/68.5; 317/101 B, 317/101 C, 101 CM; 29/625, 626, 627; 156/285, 286, 287; 264/102

[56] References Cited
UNITED STATES PATENTS

| 3,661,675 | 5/1977 | Frankowski .......................... 156/285 |
| 3,708,876 | 1/1973 | Klehms, Jr. ............................ 29/625 |

*Primary Examiner*—Darrell L. Clay
*Attorney, Agent, or Firm*—Edwin W. Uren; Ralzemond B. Parker

[57] ABSTRACT

Relates to printed circuit boards which are devoid of electrical discontinuities likely to arise in the production of two-sided circuit boards having plated-through-holes and solder fillets therein for improving the electrical interconnections. Research disclosed that the cause of these discontinuities lay in the material of the boards surrounding the holes which either included entrapped gas or matter vaporizable under the high temperatures of the liquid solder applied to fill the holes and which impaired the attainment of reliable plated-through-hole connections. A vacuum evaporation operation is incorporated in the fabrication of printed circuit boards and the like and found highly useful and efficient in the production of reliable hole connections in the boards substantially reducing if not completely eliminating any need to apply solder touch-ups to the boards thereafter. Specifically, the boards are treated prior to the soldering of the plated-through-holes to a temperature of approximately 250° F while concurrently being exposed to a vacuum of approximately $10^{-2}$ mm Hg for a sufficient time to drive out of the boards all matter vaporizable under such conditions. Inert gas may be used in the treatment chamber to hasten the heating or the cooling of the boards. The degassed circuit boards may be placed in sealed containers or bags to prevent contact with the atmosphere and the absorption of moisture and deleterious gases therefrom.

5 Claims, 4 Drawing Figures

VACUUM-HEAT TREATED PRINTED CIRCUIT BOARDS

CROSS REFERENCE TO RELATED PATENT APPLICATIONS

This is a division of copending patent application Ser. No. 794,686, filed Jan. 28, 1969, now U.S. Pat. No. 3,708,876 and also a division of copending patent application Ser. No. 2,019, filed Jan. 12, 1970, now U.S. Pat. No. 3,755,890, which is a continuation-in-part of patent application Ser. No. 794,686.

CROSS REFERENCE TO RELATED PUBLICATIONS

For an understanding of the art to which this invention relates, reference may be had to PRINTED AND INTEGRATED CIRCUITRY Materials and Processes by Schlabach and Rider and published by the McGraw-Hill Book Company, Inc., copyright 1963; SOLDERS AND SOLDERING by Howard H. Manko and published by McGraw-Hill Book Company, Inc., copyright 1964; "Experimental Evaluation of Reliable Soldering Processes" by Browning and Bester appearing in the 1963 *Proceedings of the National Symposium on Reliability and Quality Control*, pages 211 to 221; "Elimination of Fractures in Plated-Through-Holes Printed Circuit Boards by the Use of Ductile Plating" by Broache and Poch appearing in the *IEEE Transactions on Parts, Materials and Packaging*, December, 1966; PRINTED CIRCUITS HANDBOOK edited by Clyde F. Coombs, Jr. and published by McGraw-Hill Book Company, Inc., copyright 1967; and "Tips and Techniques for Printed-Wiring Design" by John Cavasin, Jr. in *Machine Design*, Apr. 27, 1967.

BACKGROUND OF THE INVENTION

Workers in the art to which this invention relates have known that the plating and soldering of holes in printed circuit boards are critical processes resulting in a considerable percentage of failures requiring such boards either to be rejected or to undergo a subsequent expensive touch-up soldering operation in order to make the boards serviceable. The referenced publications describe the difficulties and imperfections heretofore encountered and suggest several production procedures which to a certain extent may have alleviated the troubles but still failed to produce uniform, highly reliable plated-through-hole connections which substantially reduce if not eliminate the necessity for the subsequent costly touch-up solder operatons practiced by the industry. Past analysis has ascertained that the soldering operation was in some manner responsible for some of the difficulties and imperfections and one referenced publication attributed the fractures occurring in plated-through holes to the sudden thermal expansion of the board due to the heat of soldering and suggested a ductile copper plating be used to accommodate the increase in thickness of the board. Others of the referenced publications attributed the difficulties to entrapment of gases or solutions in the printed circuit boards behind the platings and surmised that the soldering operation generated enough heat to volatilize the solutions. One of the reference publications suggests a prebake cycle of 2 hours at 180° F before soldering the boards to eliminate the problem but conceded that hidden materials may be still trapped in the boards. Although helping to a limited extent, these past attempts and suggestions fell far short of providing reliable circuit interconnections between the opposite sides of the boards and failed to eliminate the costly solder touch-up operations found necessary in the practice of this art.

SUMMARY OF THE INVENTION

It is therefore an important object of the present invention to provide improved printed circuit boards.

It is another important object of the invention to provide printed circuit boards having improved plated-through-hole connections therein which assure uniform, highly reliable electrical connections through the holes to the opposite sides of the boards.

It is a further important object of the invention to provide printed circuit boards having substantially perfectly plated-through-hole connections therethrough.

It is a still further important object of the invention to provide vacuum-heat treated printed circuit boards having substantially improved inner hole connections while avoiding subsequent impairment of the boards.

In the effort of attaining these objects and advantages, it was found upon careful investigation that the source or cause of the difficulties heretofore encountered in the production of printed circuit boards and particularly those with plated-through-holes could be laid mainly if not entirely to the material of the board surrounding each hole rather than to the hole plating operation or the subsequent soldering operation. It was learned in the investigation out of which this invention arose that certain materials in the board would vaporize at the soldering temperature, the gases expelled under this heating environment would issue through cracks and fractures in the plated walls of the holes thus impairing the soldering operation. Moreover, occasionally gases would be entrapped in the subsequently applied solder which would expel portions of the solder from the hole or form a concealed gaseous void in what would otherwise appear to be a satisfactory solder fillet therein. Careful investigation by means of a laboratory apparatus revealed that when a sample plated-through-hole board was placed in a transparent liquid medium, such as silicone oil, and subjected to a high vacuum evaporation operation, bubbles of gases arose out of the board first along the cut edges thereof and then out of the plated holes therein. From this investigation it was deduced that material in the board was vaporized by the heat of the soldering operation producing gases which interferred with the acceptable production of soldered plated-through-holes in the board. Having discovered the source of the difficulties, it was found upon further experimentation that wholly reliable completely filled soldered fillets could be formed in the plated-through-holes by incorporating in the fabrication of the boards the steps of treating the boards to a vacuum evaporation operation preferably after the plating of the holes and immediately before the boards were subjected to the soldering operation. As a result of this pretreatment of the board in advance of the soldering operation, it was discovered that the plated-through-holes were completely and homogeneously filled with solder thereby eliminating the costly manual touch-up soldering operations practiced by the industry.

Various other objects, advantages and meritorious features of the invention will become fully apparent from the following specification, appended claims and the accompanying drawings wherein:

In the present state of the art, printed-wiring laminates, frequently referred to as printed circuit boards, fall into two broad categories as far as their composition is concerned, namely, paper-based phenolics and glass-based epoxies. Each type has certain advantages and disadvantages where the other does not and both are utilized extensively in this art. A third composition, a paper-based epoxy, is sometimes used as a compromise between the two major types. When used singly, these boards may have their printed-wiring layouts on only one surface and in such instance the soldering pretreatment procedure of this invention may be used to insure electrical connections on one surface of the boards. Where the printing-wiring is applied to both sides of the boards, the industry has extensively adopted the practice of forming holes in the boards opening out through the opposite surfaces and then plating these holes with electrically conductive material, such as copper, so as to connect the wiring on one side of the board with that on the other side. Following this, it has been the practice of the art, as evidenced by the above referenced publications, to introduce liquid solder into the plated-through-holes which would later solidify therein for the purpose of assuring a reliable electrical path between the opposite surfaces of the board. Finally, the art has progressed to the assembly of a plurality of such apertured boards so that a multilayer structure is formed having the holes of the layers in registry with one another. These holes are then plated with a conductive coating and subsequently liquid solder is introduced thereinto for the purpose of forming a solid fillet in each hole for improving the electrical connection intended to be performed by the plating in the hole.

Figure 2:
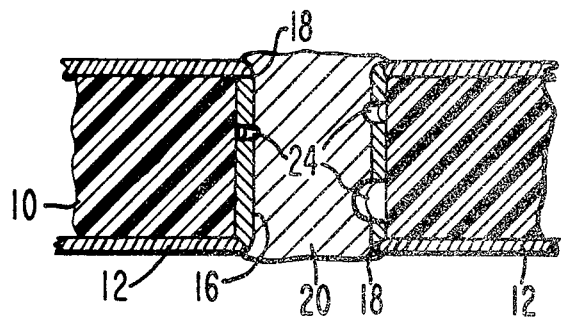
FIG. 2 is an enlarged cross-sectional view of a printed circuit board formed in accordance with this invention and taken along a line diametrically intersecting a plated-through-hole of the board, the sectional view illustrating the presence of a solder fillet substantially filling the hole and connecting the electrically conductive elements on the opposite surfaces of the board.

FIG. 2 illustrates the desired physical condition for providing a reliable interconnection between the conductive elements of a printed circuit board. The electrical insulated material constituting the board is indicated at 10 and overlaid on both surfaces thereof are conductive printed wiring elements 12. During the fabrication of this board it was subjected to an electroplating operation which laid down a conductive coating on top of the wiring elements 12 and a conductive coating or lining 16 on the wall of hole each which is intended to serve as an electrical path between the printed wiring elements 12 on the opposite side of the board. However one or more discontinuities may completey break the electrical connection between the wiring element 12 and the plating 16 in the hole. This fracture may occur as the result of poor plating but usually as the result of the introduction of molten solder 20 into the hole at approximately 450° F. The sudden increase in temperature caused by the entrance of the molten solder into the holes subjects the immediately adjacent areas of the board to a thermal shock which expands the thickness of the board and imposes a strain on the plating in the holes with the likelihood of producing a fracture. Moreover, the solder may fail in its ultimate purpose. Instead of bridging the fracture 18 to repair the connection, the solder may be insufficient or fall away from the fracture, and thus fail to provide a satisfactory circuit path through the hole.

It is evident that in the board of FIG. 2 a strong reliable electrical interconnection has been formed not only between the printed elements 12 and the plating 16 at each mouth of the hole but also the soldering fillet 20 has completely filled the hole to a level approximately flush with if not higher than that of the printed wiring and over the joint 22 thereby reinforcing the electrical connection between the wiring elements 12 and 16 of the board. FIG. 2 therefore represents the desired result in the fabrication of printed circuit boards having fully soldered plated-through-holes which is the purpose of this invention to obtain in every instance.

Figure 3:
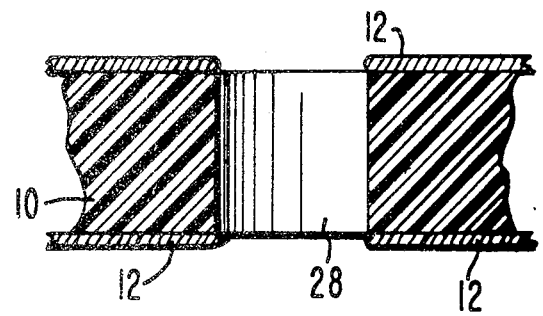
FIG. 3 is a view generally like FIG. 2 but illustrating a different condition of the printed circuit board where there is a complete absence of a plated lining or solder in the hole.

In FIG. 2, although the plated wall 16 of the hole has been perforated at several places 24 the solder 20 not only bridges these holes but also the lip fractures 18 to provide a satisfactory electrical connection. In FIG. 2 the solder fillet completely fills the hole providing a solid body of conductive material thus assuring a high quality, reliable interconnection between the opposite sides of the board. In FIG. 3 a hole 28 is illustrated in the board which does not contain a plated-wall or solder therein. Sometimes, in the plated-through-hole production operation, one or more holes in the board are either missed or such a small amount of conductive material is plated therein as to be completely incapable of forming the desired electrical interconnection. In such instances, the solder sometimes completely fills these holes even in the absence of plated material therein. At the inspection station when a board having holes so formed and soldered is visibly inspected, it would appear that a satisfactory connection had been provided because the hole is filled with solder thus obscuring the lack of hole-plating therein. What is desired, however, is that no soldering occur when no plating occurs so that at the time of the inspection the absence of solder will indicate that the hole has been missed by the plating operation. FIG. 3 is thus representative of the ideal condition where because of no or very little plating in the hole no solder was retained therein thereby making it clearly obvious to the inspector that an electrical failure has occurred for this particular hole and thus enabling it to be corrected.

Figure 1:
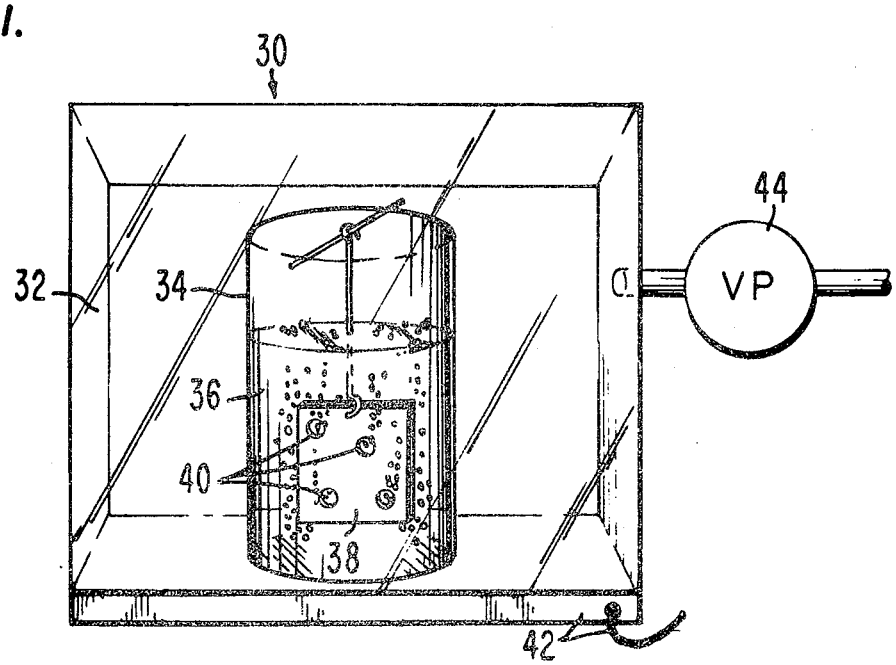
FIG. 1 is a schematic view of a laboratory apparatus utilized in the investigation of the troubles encountered in the production of printed circuit boards and illustrating how the source of trouble was discovered and utilized to improve the manufacturing process in accordance with this invention.

The problem of poor circuit board production, particularly as to plated-through-hole circuit boards, has been an industry-wide consideration for some time, and in the laboratory studies made to determine the cause I began to suspect that the cause was a physical one arising from the composition of the boards and possibly as the result of the vaporizing of certain materials in the boards at the temperatures at which the liquid solder was applied to fill the holes. To ascertain whether or not this was true, the laboratory apparatus schematically illustrated in FIG. 1 was constructed and operated. The apparatus comprised a gas tight chamber or oven generally indicated at 30 having at least one transparent wall portion 32 through which the interior could be observed. Disposed within the oven was a transparent jar or vessel 34 containing a transparent liquid, such as silicone oil, indicated at 36. Suspended within the oil were one or more sample plated-through-hole boards 38, several holes of which are indicated at 40. Means for heating the oven is indicated at 42, the capability of this means being sufficient to raise the temperature of the immersed board to that at least approximating the temperature of the molten solder later applied to fill the holes. Further associated with the oven was a vacuum pump 44 also indicated by the legend V.P. The intake of the pump was connected to the oven as shown in FIG. 1 while the outlet discharged into any suitable way. The vacuum pump had such a capability that it could reduce the pressure in the chamber 30 to below $10^{-2}$ mm Hg.

The oven 30 was heated to increasingly higher temperatures and the air pressure therein decreasingly reduced to very low pressure levels. At approximately the temperature of 250° F and at a vacuum of approximately $10^{-2}$ mm Hg, I observed bubbles rising out of the board 38 first along the cut edges thereof and then from the holes 40 thereof. This confirmed my suspicions that the imperfections and discontinuities encountered in the productin of such printed-wiring boards may be caused by the out-gassing of certain materials in the board. Under the heat of the soldering operaton certain materials in the boards vaporized and discharged from the board and apparently under such pressures as to damage the plating in the holes impairing if not breaking the electrical connections formed thereby and also to blowing out some of the molten solder introduced into the holes with the invention of assuring good electrical connection.

Confirmation of this analysis was obtained by a comparison test. I selected several sample printed circuit boards having plated-through-holes and ready for soldering and after severing each in half I then subjected one half of each pair to the vacuum evaporation treatment described in connection with the apparatus of FIG. 1 but without immersion in a liquid. In other words, one half section of each severed board was subjected to a pretreatment temperature of approximately 250° F and a vacuum of approximately $10^{-2}$ mm Hg for 3 to 4 hours, a sufficient length of time to remove substantially all of the materials in the boards which would vaporize under such conditions. Thereafter, each pretreated half section was placed side by side with its untreated half of the same board and run side by side through a conventional wave soldering apparatus to fill their respective plated-through-holes with solder. At the conclusion of the soldering operation I found that in all instances the half sections of all such severed boards subjected to the vacuum evaporation pretreatment were completely filled with solder to such an acceptable degree that no subsequent touch-ups were necessary. However, as for the remaining untreated half sections of these severed boards, the usual number of voids in the plated-through-holes were observed indicating that unsatisfactory solder fillets had been formed therein requiring solder touch-ups to bring these hole connections into acceptable conditions. Moreover, electrical tests of each pair of half sectioned boards disclosed that in all instances those half sections exposed to the vacuum evaporation treatment were 100% satisfactory, whereas their respective untreated complementing half sections had the usual number of electrical path failures and solder voids running several to a half section on the average.

A further experiment was made to confirm the feasibility of this process. A batch of 1,000 printed circuit boards having plated-through-holes was subjected to the vacuum baking step hereinabove described preparatory to the application of solder for filling the holes. Of the approximately one million holes in these boards, only eight holes were found defective and requiring manual soldering touch-ups in accordance with the practice in this art. This compares extremely favorably with the usual printed circuit board production where, for example, from one supplier of printed circuit boards having plated-through-holes there resulted an average of 15 to 20 defective soldered holes in each board requiring manual touch-ups to assure as best as could be visually determined that a reliable electrical path had been established through each hole.

For comparatively large batch processing of printed circuit boards incorporating the vacuum evaporation treatment of this invention, the apparatus may be a form of vacuum furnace equipment which is currently available on the market. For example, several types of such vacuum ovens or furnaces are produced by the Sunbeam Vacuum Furnace Corporation of North Billerica, Massachusetts. The vacuum furnace may have an interior dimension of 4×4×4 feet for forming a chamber for holding a large number of printed circuit boards to be treated. A hinged front door may be provided with a sealed glass porthole for visual observation of the interior of the furnace. The chamber may contain several shelves each of which may be, an open frame or grid to allow for the flow of gas therethrough and which may be permanently installed in the chamber. The shelving should be formed of material which will not gasify under the heat and high vacuum conditions at which the furnace is operated and should be thoroughly cleaned of all grease and foreign material. Stainless steel is highly suitable material for this purpose.

The printed circuit boards to be treated are placed in portable elongated trays and stacked preferably vertically within the tray and slightly spaced apart from one another. The tray should be of opened or reticulated metal work, preferably also formed of stainless steel, in order to allow free flow of gaseous substances.

Suitable equipment is provided for raising the temperature in the chamber and concurrently reducing the gas pressure therein. Certain parts of the shelves are shaped to contain electrical heating resistances which are enclosed or embedded within ceramic material.

The reduction in the gas pressure within the chamber may be obtained in a conventional manner and for this purpose a conduit or pipe may be provided which opens into the upper portion of the chamber and extends exteriorly of the furnace to apparatus for producing a high vacuum in the chamber. Suitable equipment of this nature includes a condenser in the form of a filter cold trap and a vacuum producing oil pump which is continuously operated during the treatment period to draw out any gases present in the chamber. Preferably, the vacuum pump reduces the pressure in the chamber to a vacuum level of at least 1 Torr. A desirable vacuum condition has been found to be approximately $10^{-2}$ mm Hg as previously set forth herein. A blower may be connected to the outlet of the pump to facilitate the removal of the outgassed material delivered by the pump to a vent. A vacuum gauge may be connected to the conduit near its connection to the furnace to visually indicate the vacuum conditions in the chamber.

In the operation of the described vacuum furnace equipment for carrying out the printed circuit board treatment, the trays loaded with the printed circuit boards in the upright manner previously described are placed on the shelves in the chamber. Thereafter, with the chamber door closed and everything properly sealed the vacuum furnace is readied for operation. Its temperature control is set to a maximum limit which may, as previously described, be approximately 250° F. The vacuum pump is set to lower the gas pressure within the chamber to below one Torr and for example to a vacuum condition of approximately $10^{-2}$ mm Hg. It was found in the experiments conducted in connection with this invention that for the operating conditions of a temperature of 250° F and a high vacuum of $10^{-2}$ mm Hg that a time period of 3 to 5 hours was usually sufficient to completely outgas the boards for the purpose of this invention. Following the batch treatment of the boards within the vacuum furnace they are removed, and without further treatment insofar as the composition of the boards is concerned they are subjected to the soldering operation for filling the holes with molten solder. As in conventional practice, the boards are then cooled with the result that the solder hardens and forms solid electrical conductive fillets completely filling the plated-through-holes of the boards, such as illustrated at 20 in FIG. 2.

The three control factors of the vacuum baking treatment, namely, temperature, vacuum and time, may be varied within limits. For example, a higher temperature can be applied to the printed circuit boards in the chamber of the vacuum furnace so long as the temperature does not exceed the fusion temperature of the boards or otherwise cause a detrimental change therein. Such higher temperature could shorten the duration of the treatment or enable less vacuum to be applied, or both. Similarly, a higher vacuum below $10^{-2}$ mm Hg applied to the vacuum furnace chamber 5 will enable the duration of the treatment to be reduced or enable a lower temperature to be used, or both. Lastly, an increased time period for the treatment of the boards in the chamber, such as 10 to 12 hours, will enable the treatment to be practiced at lower temperatures and less vacuum. Although not intended to be limiting but merely to set forth a practical range, the temperature for the vacuum oven may be set between 212° F and a temperature no higher than that which would be detrimental to the boards and any components thereon.

The vacuum evaporation treatment is applicable to both paper-based phenolic boards and glass-based epoxy boards and to similar substrate compositions utilizable for printed circuit boards. Whatever the basic material of the boards is, this pretreatment operation before solder is flowed into the plated-through-holes results in boards free of substantially all material therein which would vaporize at the temperatures leading up to and including that of the molten solder used for filling the holes. Whether considered as an intermediary or final product, the result is a high vacuum baked printed circuit board which is dimensionally and compositionally stable not only at the time of the application of the liquid solder thereto but also in the subsequent use of the soldered board in electrical equipment for which it is designed.

In order to expedite or reduce the time period of the treatment I have found that the boards will be heated quicker and without detriment to the printed wiring elements thereon if this is accomplished in the presence of an inert gas, such as argon. Instead of concurrently subjecting the boards to both vacuum and heat after they are loaded into the chamber of the vacuum furnace, it is better to remove or pump out the atmosphere in the chamber and replace it with an inert gas, for example argon because of its comparatively low cost. Inert gas is substituted for air because in this heated condition the oxygen in the air will have a greater tendency to oxidize the conductive elements on the boards. Accordingly, after sealing the boards in the chamber, the air therewithin is pumped out and replaced by the inert gas, such as argon, preferably at a pressure approaching if not equaling that of the atmosphere. The chamber is now heated, using the argon gas to speed up the diffusion of heat throughout the chamber. Without the presence of such a gas, the boards would be heated only by the slow process of radiation, whereas the gas serves as a medium for the conduction and convection of heat to the boards. When the furnace reaches operating temperature, such as 250° F, the vacuum pump is started. This will exhaust the argon from the treatment chamber as it reduces the pressure in the chamber down to the desired vacuum condition of approximately $10^{-2}$ mm Hg.

When the vacuum-heat treatment is completed, the boards are left in the furnace until the temperature of the boards approaches room temperature. This cooling operation may be expedited by bleeding an inert gas, such as argon, back into the chamber which then provides a medium for conducting heat from the boards.

Figure 4:
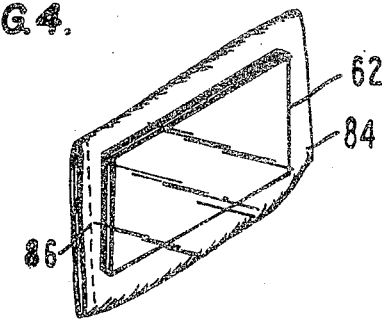
FIG. 4 is a detailed view illustrating the step of hermetically sealing the treated printed circuit boards from the atmosphere prior to soldering.

The problem of re-absorption of moisture by the boards after the degassing operation may become evident when an elapse of time occurs between the degassing operation and the soldering of the boards. The ideal situation is to assemble and solder the boards immediately after degassing, but frequently the degassed boards are stored for varying periods of time before use. Investigation revealed that within a period of 24 hours some degassed boards could gain back up to 50% of the weight which was lost during the degassing operation. This re-absorption of moisture can be avoid by immediately placing the degassed boards in hermetically sealed containers, such as plastic bags, to prevent contact with the atmosphere thus precluding absorption of moisture therefrom. FIG. 4 illustrates an air-tight provision for this purpose where a plurality of vacuum baked printed circuit boards 62 are enclosed in a plastic bag 84 and the mouth heat sealed at 86 to prevent inflow of atmosphere. As each bag is filled, the air contained therein can be flushed out and replaced by an inert gas, such as nitrogen. This inert gas will be absorbed by the boards and assist in inhibiting ingress of moisture when the boards are exposed to the atmosphere.

With the inclusion of this vacuum evaporation step in the process of making printed circuit boards and the like, any matter forming part of the board's original composition or subsequently introduced thereinto which is vaporizable at the soldering temperature is substantially completely expelled from the board. By this treatment, the imperfections and discontinuities heretofore encountered as a result of the soldering operation are avoided, thereby eliminating substantially all soldering touch-ups and repairs frequently found necessary on many printed circuit boards. The avoidance of the costly and time consuming touch-up operations reduces the over all time for fabricating printed circuit boards. The result is a greater production of such boards in a given time interval and at lower cost and concomitantly with an improved, more reliable product.

With particular embodiments of the invention have been shown or discussed, it will be understood, of course, that it is not desired that the invention be limited thereto since modifications may be made. For example, although the high vacuum evaporation treatment is illustrated herein as being applied to printed circuit substrates or boards of one layer, the treatment is similarly effective when applied to multilayered apertured boards before solder is introduced into the registered plated-through holes thereof. It is, therefore contemplated by the appended claims to cover any such modifications as fall within the true spirit and scope of the invention.

What is claimed is:

1. A high vacuum baked circuit board formed of a thermoset plastic composition and bearing electric conductive elements on at least one surface thereof, said board being substantially free of all material therein vaporizable at temperatures up to approximately 450°F.

2. An intermediate product in the manufacture of printed circuit boards, said product being a board composed at least in part of a thermoset plastic composition and bearing electrical conductors on exterior surface portions thereof connected by one or more plated-through-holes extending through the board, the area of said board in the immediate vicinity of each plated-through-hole being substantially free from substances capable of evolving gases under soldering conditions, and means inhibiting the ingress of moisture into the board, said means comprising a container hermetically enclosing one or more of such boards and also hermetically sealing an inert gas therewithin.

3. An improved circuit board formed of a thermoset plastic composition and bearing one or more electrical conductors on opposite exterior surface portions thereof and having one or more plated-through-holes extending through the board and opening through one of the conductors on each of the opposite exterior surface portions of the board, said one or more plated-through-holes each being completely filled with a solid fillet of solder initially deposited in its respective hole in a molten state, and the areas of said board in the immediate vicinity of the holes being substantially free of material vaporizable up to the temperature of the molten solder deposited in the holes, and means for inhibiting the ingress of moisture into the board comprising an inert gas absorbed within the board.

4. An intermediate product in the manufacture of printed circuit boards, said product being a board composed at least in part of a thermoset plastic composition and bearing electrical conductors on exterior surface portions thereof connected by one or more plated-through-holes extending through the board, the area of said board in the immediate vicinity of each plated-through-hole being substantially free from substances capable of evolving gases under soldering conditions, and means inhibiting the ingress of moisture into the board, said means comprising an inert gas absorbed within the board.

5. An improved circuit board formed of a thermoset plastic composition and bearing one or more electrical conductors on opposite exterior surface portions thereof and having one or more plated-through-holes extending through the board and opening through one of the conductors on each of the opposite exterior surface portions of the board, said one or more plated-through-holes each being completely filled with a solid fillet of solder initially deposited in its respective hole in a molten state, and the areas of said board in the immediate vicinity of the holes being substantially free of material vaporizable up to the temperature of the molten solder deposited in the holes, and means for inhibiting the ingress of moisture into the board comprising a container hermetically enclosing one or more of such boards and also hermetically sealing an inert gas therewithin.

* * * * *

UNITED STATES PATENT OFFICE
CERTIFICATE OF CORRECTION

Patent No. 3,953,663     Dated April 27, 1976

Inventor(s) William G. Klehm, Jr.

It is certified that error appears in the above-identified patent and that said Letters Patent are hereby corrected as shown below:

The inventor's name, should read -- William G. Klehm, Jr. --.

Column 1, line 51, "operatons" should read -- operations --.

Column 3, line 64, "of hole each" should read -- of each hole --. Column 5, line 31, "operaton" should read -- operation --; line 36, "invention" should read -- intention --. Column 7, line 41, after "chamber" delete - "5". Column 9, line 8, "with" should read -- While --.

Signed and Sealed this

Thirteenth Day of July 1976

[SEAL]

Attest:

RUTH C. MASON
Attesting Officer

C. MARSHALL DANN
Commissioner of Patents and Trademarks